United States Patent
Mumford et al.

(10) Patent No.: US 11,218,139 B2
(45) Date of Patent: Jan. 4, 2022

(54) TEST AND CHARACTERIZATION OF RING IN SUPERCONDUCTING DOMAIN THROUGH BUILT-IN SELF-TEST

(71) Applicants: Clint Wayne Mumford, Apex, NC (US); Kshitiz Saxena, Cary, NC (US); Miguel Comparan, Kenmore, WA (US); Adam Muff, Woodingville, WA (US); Oscar Rosell, Hospitalet de Llobregat (ES)

(72) Inventors: Clint Wayne Mumford, Apex, NC (US); Kshitiz Saxena, Cary, NC (US); Miguel Comparan, Kenmore, WA (US); Adam Muff, Woodingville, WA (US); Oscar Rosell, Hospitalet de Llobregat (ES)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/874,252

(22) Filed: May 14, 2020

(65) Prior Publication Data

US 2021/0359672 A1    Nov. 18, 2021

(51) Int. Cl.
| | |
|---|---|
| *G06F 7/58* | (2006.01) |
| *H03K 5/131* | (2014.01) |
| *H03K 3/38* | (2006.01) |
| *G01R 31/317* | (2006.01) |
| *G06N 10/00* | (2019.01) |
| *H03K 19/195* | (2006.01) |

(52) U.S. Cl.
CPC ....... *H03K 5/131* (2013.01); *G01R 31/31724* (2013.01); *G06N 10/00* (2019.01); *H03K 3/38* (2013.01); *H03K 19/1952* (2013.01)

(58) Field of Classification Search
CPC .... G01R 31/31724; G06N 10/00; H03K 3/38; H03K 5/131; H03K 19/1952
See application file for complete search history.

(56) References Cited

U.S. PATENT DOCUMENTS

| | | | |
|---|---|---|---|
| 7,428,678 B1 | 9/2008 | Berndt et al. | |
| 8,679,861 B2 * | 3/2014 | Bose | H01L 22/14 438/4 |

(Continued)

OTHER PUBLICATIONS

International Search Report and Written Opinion issued for corresponding PCT/US2021/027189, dated Jul. 28, 2021.

*Primary Examiner* — Kurtis R Bahr
(74) *Attorney, Agent, or Firm* — Tarolli, Sundheim, Covell & Tummino LLP

(57) ABSTRACT

Ring packet built-in self-test (PBIST) circuitry configured to detect errors in wires connecting a ring of superconducting chips includes circuitry configured to make the PBIST immune to interchip latency and still allow the PBIST to test a stop-to-stop connection. By making a PBIST independent of latency, an entire ring can be characterized for latency and for its bit-error rate prior to running any functional test. Such systems and associated methods can be scaled to larger platforms having any number of ring stops. The PBIST circuitry can function as either transmitter or receiver, or both, to test an entire ring. The PBIST can also be used to tune clocks in the ring to achieve the lowest overall bit error rate (BER) in the ring.

20 Claims, 10 Drawing Sheets

(56) References Cited

U.S. PATENT DOCUMENTS

| | | |
|---|---|---|
| 2005/0276280 A1 | 12/2005 | Karmi et al. |
| 2009/0164854 A1 | 6/2009 | Saponas et al. |
| 2009/0304054 A1 | 12/2009 | Tonietto et al. |
| 2015/0199178 A1* | 7/2015 | Shi .......................... G06F 7/588 |
| | | 708/254 |
| 2017/0115353 A1* | 4/2017 | Sonawane ........ G01R 31/31724 |
| 2017/0372217 A1 | 12/2017 | Jasionowski |
| 2018/0350411 A1 | 12/2018 | Ware et al. |
| 2020/0174958 A1* | 6/2020 | Mosko .................. G06F 21/604 |

* cited by examiner

TEST AND CHARACTERIZATION OF RING IN SUPERCONDUCTING DOMAIN THROUGH BUILT-IN SELF-TEST

TECHNICAL FIELD

The present invention relates generally to quantum and classical digital superconducting circuits, particularly to the test and characterization of a ring in the superconducting domain through a built-in self-test (BIST).

BACKGROUND

In the field of digital logic, extensive use is made of well-known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor-based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins. Reciprocal quantum logic (RQL) is one technology used for implementing superconducting logic circuitry, including various types of logic gates. Two varieties of RQL that have been described include the newer phase-mock logic (PML) and the original variety of RQL, which has been termed wave-pipeline logic (WPL).

In the context of integrated circuits (ICs) designed to perform digital computing functions, a built-in self-test (BIST) involves circuitry fabricated onto the IC configured to verify all or a portion of the computing functionality of the IC. IEEE 1149.1, also known as JTAG (an initialism for the Joint Test Action Group), is an industry standard for the implementation and operation of on-chip instrumentation used for testing ICs and circuit boards after manufacture. A JTAG interface can be used to access, control, and receive results from a BIST. Using JTAG, a BIST can be configured by providing data through a test data in (TDI) pin of a JTAG test access port (TAP) and results can be obtained from a test data out (TDO) pin of the TAP. For example, a JTAG interface can be used to send test instructions serially into an instruction register (IR) and to send test data or retrieve test results from a data register (DR) of the BIST.

SUMMARY

One example includes superconducting built-in self-test (BIST) circuitry having controller circuitry and self-test logic circuitry. The controller circuitry is configured to receive self-test configuration programming inputs through an interface and to output self-test results through the interface. The self-test logic circuitry includes a state machine, a comparator, and an error counter, and is configured to receive control signals from the controller circuitry. The self-test logic circuitry is further configured to generate test data for transmission onto one or more channels of a superconducting ring of chips, based on the BIST circuitry being programmed as a transmitter, and to accumulate an error count in the error counter based on comparison, with the comparator, of receive test data with compare data, based on the BIST circuitry being programmed as a receiver. The error count is indicative of the integrity of one or more channels connecting different chips in the superconducting ring.

Another example includes a method of testing connections between ring stops in superconducting ring circuitry. A number of instances of superconducting BIST circuitry in chips in a superconducting ring are programmed to be one or both of senders of test data and/or receivers of test data, or otherwise passers of test data. Each receiver is configured to compare test data to compare data generated within the receiver. Each passer being configured to retransmit received test data to an adjacent ring stop. A test data bitstream is generated and transmitted at one or more microwave frequencies from a sender through a ring connection as a series of superconducting pulses. The test data bitstream is received at a receiver in the ring. The received test data bitstream is compared with a compare data bitstream generated by the receiver. This comparison is initiated based on the receiver detecting a preamble in the received test data bitstream. An error count based on the comparison of the received test data bitstream with the compare data bitstream is accumulated. The error count or an error metric based on the error count is retrieved from the receiver via an interface.

Yet another example includes reciprocal quantum logic (RQL) BIST circuitry. The BIST circuitry includes ring outputs to a plurality of superconducting ring connection channels and ring inputs from a plurality of superconducting ring connection channels. The BIST circuitry further includes a phase-mode logic (PML) BIST controller accessible via a Joint Test Action Group (JTAG) interface and wave-pipeline logic (WPL) BIST logic coupled to the BIST controller. The BIST logic includes a state machine configured to provide a data generation start signal. The BIST logic further includes a linear-feedback shift register (LFSR) configured to begin generating a test data and/or compare data bitstream based on receiving the data generation start signal. The BIST logic further includes a pipe stage configured to store the compare data bitstream. The BIST logic further includes a comparator configured to begin comparing test data received from the ring inputs with the compare data stored in the pipe stage upon detection of a preamble in the received test data. The BIST logic further includes an error counter configured to accumulate an error count based on the comparison of the received test data with the compare data.

DETAILED DESCRIPTION

Ring packet built-in self-test (PBIST) circuitry configured to detect errors in wires connecting a ring of superconducting chips can include circuitry configured to make the PBIST immune to interchip latency and still allow the PBIST to test a stop-to-stop connection. By making a PBIST independent of latency, an entire ring can be characterized for latency and for its bit-error rate prior to running any functional test. Such systems and associated methods can be scaled to larger platforms having any number of ring stops. The PBIST circuitry can function as either transmitter or receiver, or both, to test an entire ring. The PBIST can also be used to tune clocks in the ring to achieve the lowest overall bit error rate (BER) in the ring.

Some superconducting computational systems can be fabricated on a single integrated circuit (IC) produced as a chip. Others involve multiple ICs coupled to each other on a printed circuit board (PCB). Still others couple multiple such boards, each of which may have one or more IC chips on it. The chips can be arranged as a ring, in which signals are passed along superconducting wires between chips and/or between boards, in a circulating manner such that signals can eventually arrive back at their chip of origin. For example, connectivity between ring chips can be provided by a bus of wires implemented with superconducting wave-pipeline tape. The number of wires (channels) in the bus can be configured to provide a desired amount of bandwidth. Data flow in such a ring can be unidirectional. Each chip serving as a node in the ring can be referred to as a "ring stop," or simply as a "stop." Between any two stops, one stop may be denominated the transmitter and the other stop may be denominated the receiver, to send and receive data and/or instructions during non-test functioning.

The requirement that superconducting circuitry must be cooled to cryogenic temperatures in order to function can complicate testing of newly manufactured circuitry. In contrast to CMOS circuitry, where connections between chips can be tested for latency at room temperature and thus be known in advance of system assembly, in a superconducting system it can be the case that an entire system of multiple chips needs to be fabricated and connected together ("wired up") before cooling to superconducting temperatures for testing. The cooling requirement complicates the testing of newly manufactured superconducting computing systems and complicates the localization of faults within such circuitry. There is a need to be able to test after assembly that a superconducting ring works. In particular, it is desirable to be able to diagnose which sections of the ring are the sources of functional issues in the case of assembly faults. Still further, it is desirable to be able to conduct such testing without needing to ascertain interchip connection latencies in advance.

Figure 1:
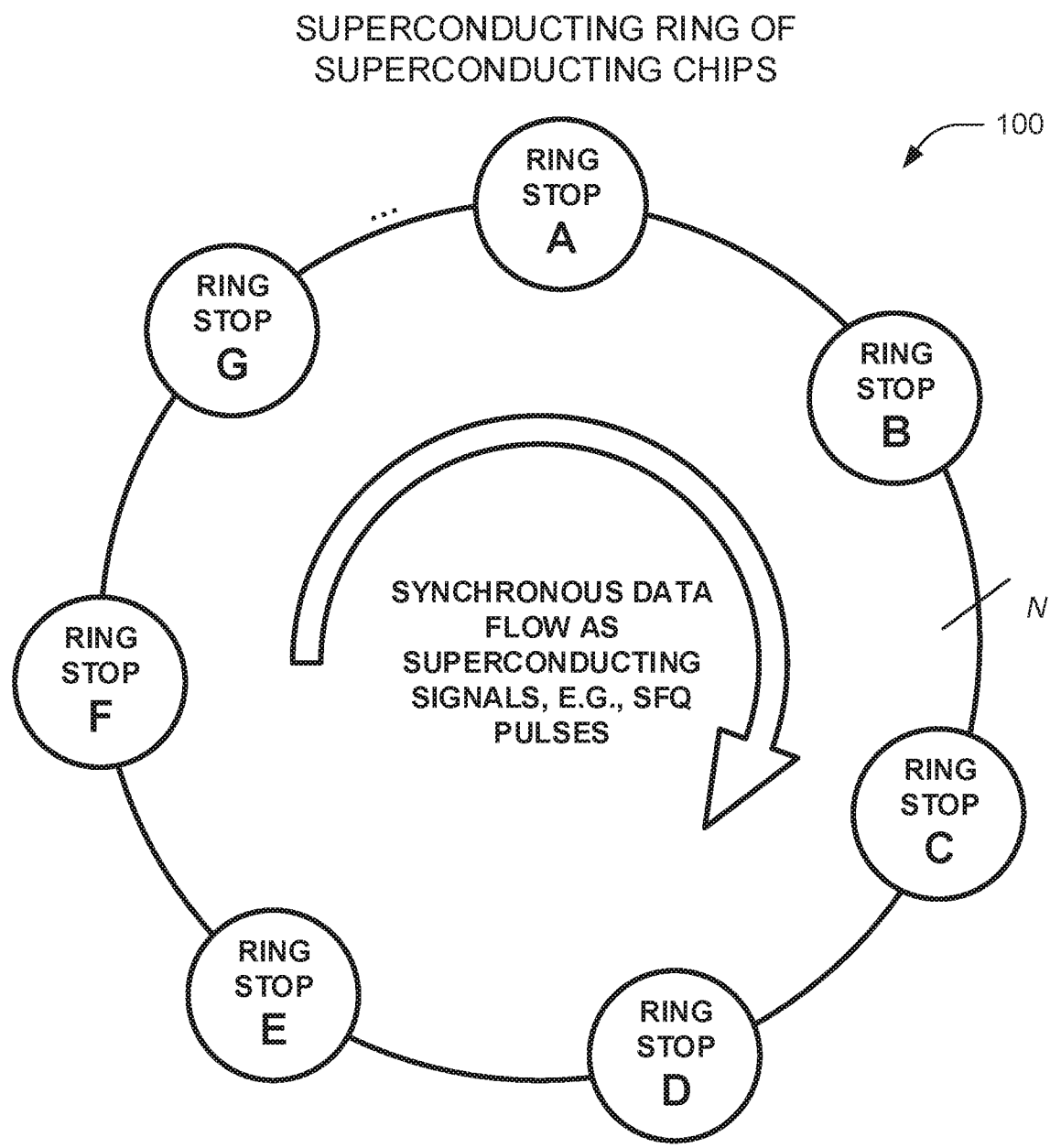
FIG. 1 is a network diagram of an example superconducting ring of superconducting chips ("ring stops").

FIG. 1 illustrates an example superconducting ring 100 connecting a number of stops labeled with letters of the alphabet. Although for simplicity of illustration only seven stops are illustrated, ring 100 can include any number of stops, as indicated by the ellipsis between stops G and A. The solid line connecting each stop in the ring can represent any number N of physical electrical connections, each connection serving as a separate channel for transmission of superconducting signals. Such signals can be sent, for example, as superconducting pulses, e.g., single flux quantum (SFQ) pulses characteristic of reciprocal quantum logic (RQL) signal transmission. In various examples, the number N of channels connecting two nodes in a ring can one, two, four, eight, sixteen, or some other number.

The latency of connections between stops, that is, the amount of time it takes for a signal to be received at a receiver on any particular channel after being transmitted by the transmitter, is dependent upon the physical length of the corresponding connecting wire and can differ for different pairs of stops and, in some cases, for different channels connecting the same two stops. For example, on a given channel, the latency between stop A and stop B can differ from the latency between stop B and stop C, and can also differ from the latency between stop A and stop C.

Any given transmission channel between any two stops in ring 100 can suffer from any one or more various types of faults that may prohibit or degrade superconducting signal transmission between stops in ring 100. Electrically shorted connections and electrically open connections can prohibit signal transmission entirely, while intermittently open connections may permit signal transmission at some times but not at others. Electromagnetic coupling between parallel chip-connecting wires in a bus can induce crosstalk between the wires. Noise can be introduced into connections from the ambient environment or from within circuitry on any one or more ring stops. Inadequate cooling or fabrication defects can introduce intolerable levels of electrical resistance into connections that are meant to be superconducting, attenuating signal transmission. Defects in circuitry or transmission lines can create stuck-at-zero or stuck-at-pulse fault conditions. These and other types of faults can increase the bit error rate (BER) of connections within the ring.

The quality of a connection between a transmitter and a receiver can be tested with a built-in self-test (BIST) integrated into a chip that serves as a stop in the ring. As an example, a BIST can send known transmission test data out through the ring, receive incoming data corresponding to the sent transmission test data after it has traversed a complete loop of the ring, and compare the received incoming data to the sent transmission test data. If the comparison indicates that the incoming data is identical to the test data, all of the ring connections traversed by the test data can be said to be integral. On the other hand, for each instance that the test data and the incoming data differ, an error counter can be incremented. In some examples, separate error counters can be employed for different channels and can be used to characterize a respective BER for each channel. BER data can be reported out of the BIST for analysis. Additionally or alternatively, upon accumulation of a threshold number of errors in the error counter, it may be determined that at least one connection between nodes in the ring is faulty, and an interrupt or other alert signal can then be generated, prompting faulty hardware to be repaired or replaced.

Under data transmission operating conditions (non-test mode), ring 100 can be a configured as a packet-switching system, in which the bandwidth of the communication medium (ring connections) is shared between multiple communication sessions. In a packet-switching system, transmitted data is formed into packets and the packets are transmitted across all the multiple channels of the system, such that it may take multiple transmission cycles to transmit all of the data organized as payloads of a plurality of packets. In some examples, under BIST operating conditions (test mode), in order to more effectively be able to diagnose ring faults, ring 100 can be configured as a circuit-switching system. When configured as a circuit-switching system, transmission circuits in ring 100 can be pre-allocated for the duration of a session, and test data can be transmitted as a continuous bit stream. In other examples, ring 100 can remain configured as a packet-switching system during BIST operation, and test data can be provided as payloads in packets.

Although the integrity of all channels in ring 100 can be characterized with as few as one ring stop being equipped with BIST hardware, such that the BIST-equipped chip serves as both transmitter and receiver for channel integrity tests, such an arrangement may not make it possible to localize faults to individual interchip connections. A technician endeavoring to address faulty connections in a ring may not know which connections to examine, repair, or replace if only the ring as a whole has been fault-characterized by the BIST.

Multiple chips in ring 100 can be outfitted with identical or similar BIST hardware. BIST hardware in each chip can be configured such that the test data sent by a transmitter chip is known to a receiver chip, permitting the receiver chip to perform the comparison of the incoming data to compare data that is identical to the originally transmitted test data, even though the receiver chip did not itself transmit the test data and even though the transmitted data may not have traversed a complete loop of the ring. In this way, individual connections between stops can be tested and connection faults can be localized to a particular connection between two stops in the ring. In some examples, every stop in ring 100 can be outfitted with BIST hardware. BER results can be reported from BIST hardware via test interfaces in each stop, and/or an interrupt or other alert signal can be generated upon accumulation of an error counter to a threshold number of errors, prompting faulty hardware to be repaired or replaced. Portions of BIST hardware within the transmitter and receiver can be respectively referred to as an injector and a sink, or a checker. Injector circuitry functions to inject test signals into the ring, and sink or checker circuitry functions to compare received test signals with compare data.

BIST hardware in one or more ring stops can include a test access mechanism (TAM) enabling communication with the BIST hardware from outside of the chip on which the BIST hardware resides to configure, program, start, or stop a BIST, and to retrieve BIST results. In some examples, the TAM can be implemented through a Joint Test Action Group (JTAG) interface, which includes a plurality of pins (e.g., four or five pins) that are utilized to configure, start, or stop tests and/or to extract test information following a test. Other types of interfaces can also be used for the TAM.

Figure 2:
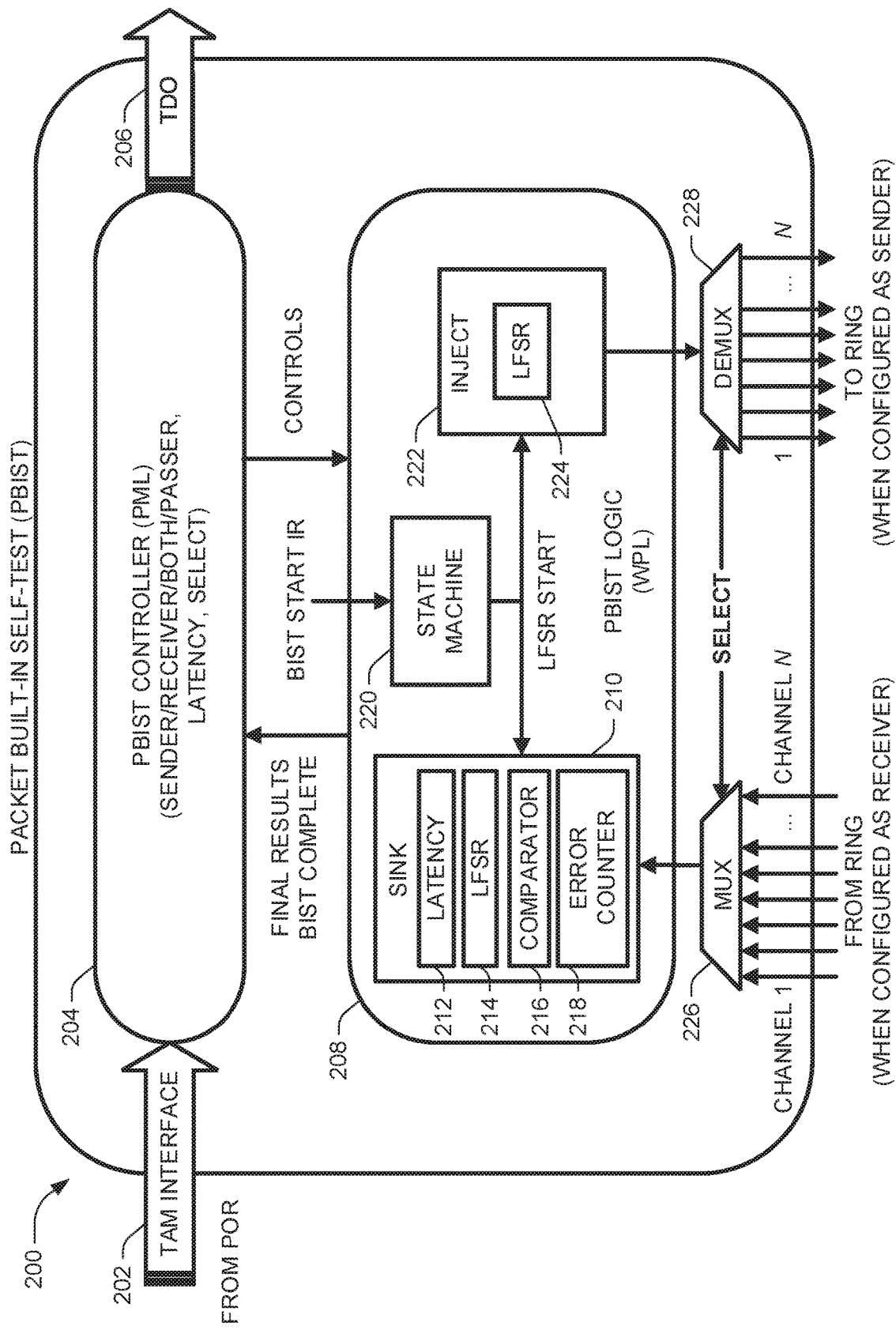
FIG. 2 is a block diagram of an example packet built-in self-test (PBIST) for use in a ring stop.

FIG. 2 illustrates example packet built-in self-test (PBIST) hardware 200 that can be incorporated into a superconducting chip serving as a ring stop in a superconducting ring like that of ring 100 illustrated in FIG. 1. Ring connections are shown at the bottom of FIG. 2 (with arrows representing channels 1 through N coming "from ring" and channels 1 through N going "to ring") and TAM interface connections are shown at the top left and top right of FIG. 2. The TAM can implement, for example, a JTAG interface. Interface inputs 202, which can come, from example, from power-on-reset (POR) circuitry, feed into a PBIST controller 204 that can be implemented, for example, using reciprocal quantum logic (RQL), e.g., phase-mode logic (PML) RQL. PBIST logic 208, on the other hand, can be implemented using, for example, wave-pipeline logic (WPL) RQL.

Signals provided by interface 202 configure the PBIST hardware 200 as either, both, or neither of a sender or receiver of test signals. If neither, the PBIST hardware 200 is designated a passer, and merely receives test signals and passes them on to the next stop in the ring without performing any comparison or generating any BER count. Signals provided by interface 202 can also program latency values, characterizing the latencies of channels in the ring, into latency register(s) 212, via PBIST controller 204. Signals provided by interface 202 can include a select signal indicative of which channel or channels are to be tested in a given test. In some examples, each test only tests one channel at a time. In such examples, in an N-channel ring system, a $\log_2(N)$-bit select signal can indicate the channel to be tested. In some examples, multiple channels can be tested at a time, which can potentially provide fault information about errors introduced as a result of crosstalk or mistiming between channels. For example, in an N-channel ring system, an N-bit select signal can indicate the channels to be tested. A BIST start instruction register (IR) can be provided to instances of PBIST hardware 200 in a ring to initiate a programmed test.

PBIST controller 204 can provide control signals to PBIST logic 208. PBIST logic 208 can include a state machine 220 configured to control the functioning of the PBIST during a test, inject circuitry 222 configured to inject test signals into the ring, and sink circuitry 210 configured to receive and compare test signals from the ring. In example PBIST hardware 200, state machine 220 can be configured, for example, to place PBIST logic 220 in one of several states including an idle state, during which no connectivity testing is occurring, and a testing state. At the beginning of the testing state, as triggered by a signal from the BIST start IR, state machine 220 can send a signal to inject circuitry 222 and/or sink circuitry 210 indicating that the test has started, whereupon, based on the PBIST hardware 200 being configured as either a sender or both a sender and a receiver, inject circuitry 220 can begin generating test data for transmission on the ring, and, based on the PBIST hardware 200 being configured as either a receiver or both a sender and a receiver, sink circuitry 210 can begin generating compare data at some latency time after receiving the start signal from state machine 220.

Inject circuitry 222 can include circuitry to generate test signals. In some examples, inject circuitry 222 can include a memory array (not shown) with programmed test values to be sent as test signals. The memory array can be non-writable and the test values can be set at the time of chip fabrication, and/or the memory can be writable and can be re-programmed by the PBIST controller 204 based on values received through the interface 202. Such a memory array may be unduly complex in terms of part count and fabrication requirements. Thus, inject circuitry 222 can include a linear feedback shift register (LFSR) 224 configured to generate a pseudo-random maximum-length sequence of values as test data. The LFSR 224 can be so configured by arranging its registers and XOR gates so as to choose as its characteristic polynomial a primitive polynomial that will allow the LFSR 224 to generate virtually all possible non-zero test data combinations. The size of the LSFR can be, for example, 8-bit, or 16-bit; a larger LSFR allows longer patterns to be tested. Output of test data values from the inject circuitry 222, whether from a memory array, LFSR 224, or otherwise, can be provided to demultiplexer 228 for provision of the test data to the selected channels during the test. As described above, the select signal can be the appropriate bit width to select from among the N channels, and the demultiplexer 228 can be designed to permit transmission of test data on the selected channel(s).

Sink circuitry 210 can receive signals from connections to an adjacent ring stop via multiplexer 226, which can operate, for example, based on the same select signal provided to demultiplexer 228. Sink circuitry 210 can be configured to generate compare data identical to the transmitted test data generated by the same instance of the PBIST hardware 200 or by a different instance of the PBIST hardware located elsewhere in the ring. In some examples, sink circuitry 210 can retrieve such compare data from a memory array (not shown), which can be the same array as or a separate instance of the memory array that may be included in inject circuitry 222. As described above, the test data contents of the memory array can be set at fabrication time and/or can be programmed via interface 202. As illustrated, however, sink circuitry 210 includes an LFSR 214 to generate compare data. LFSR 214 in sink circuitry 210 can be the same as or a separate instance of LFSR 224 in inject circuitry 222. Sink circuitry 210 can further include a comparator 216 configured to compare received data from multiplexer 226 with compare data. Through such comparison, PBIST hardware 200 is capable of testing if there is any uplink fault, stuck-at-zero condition, stuck-at-pulse condition, or any other type of fault in channels in the superconducting ring between transmitter and receiver. Sink circuitry 210 can further include an error counter 218 (e.g., an accumulator) configured to be incremented to account for errors. For example, error counter 218 can be incremented for each bit difference detected by comparator 216 to provide a BER. Error counter 218 can in some examples consist of N separate counters, one for each channel, such that error rates can be determined for each channel separately. Sink circuitry 210 can be configured to begin testing incoming data at some delay time after receiving a test start signal from state machine 220, the delay time being defined by a value stored in a latency register 212 characterizing the latency between transmitter and receiver for the test being run.

As one example of using PBIST hardware 200, when a respective instance of PBIST hardware 200 is included in multiple chips in a superconducting ring, LFSR 224, used to generate test patterns in a sender, can be initialized (e.g., via programming provided through interface 202) to an initial value, and LFSR 214, used to generate compare data in one or more receivers, if a different instance from LFSR 224, can be initialized to the same value (e.g., via programming provided through interface 202). Error counter 218 can be initialized to zero in the receiver(s). A timeout counter (not shown) can also be initialized on both the sender and the one or more receivers. On each iteration of LFSR 224, a new pattern value can be generated. Based on PBIST hardware 200 being configured as a receiver, as bits are received and compared, error counter 218 can accumulate the number of error bits detected. Upon each timeout, a new iteration of the LFSR 224 can generate a new test pattern. In the case that the PBIST system is configured as a circuit-switching system, LFSR values can be sent bit-by-bit out through the demultiplexer 228 across the selected channel(s). In the case that the PBIST system is configured as a packet-switching system, for each LFSR value, the inject circuitry 222 can generate a regular ring packet that includes LFSR-generated test data as payload. Each BIST packet can be injected into the ring just as any non-test packet. Each designated receiver can look for packets in the ring. The ring's regular target detection logic can be bypassed by sinking any detected incoming packet into a buffer. For each payload sunk, sink circuitry 210 can compare the incoming test data value to its own LFSR value. A difference in value can be signaled as an error, and for each error, error counter 218 can be incremented. Final results, whether as one or more error counts, one or more BERs, and/or some other metric(s) based on the error count, can be reported back to PBIST controller 204, which can output a result on, for example, a test data out (TDO) pin 206.

Even though the data flow through the ring may be synchronous, without accurately programmed latency value(s), sink circuitry in a receiver may not know the correct time to start generating compare data or otherwise comparing pre-programmed compare data with received test data. For example, if sink circuitry 208 were to start the compare process immediately upon being triggered by a start signal from state machine 220—the same start signal used to trigger inject circuitry 222 to start generating (or accessing) and transmitting test data—the comparison would be to signals not yet arrived as test data, which comparison would only show an inaccurately very high BER. In PBIST system 200, the latency value(s) can be programmable through TAM interface 202 as having been determined prior to running the testing, and/or can be determined by the PBIST hardware 200 itself, through functional tests that determine latency through a trial-and-error method. As one example, the PBIST hardware instances of a ring can be programmed to iteratively repeat ring testing for each channel and for each combination of transmitter/receiver pairs in the ring, over a variety of probable latency values for each channel. Then, for each transmitter/receiver/channel combination, the latency value yielding the lowest BER can be the one chosen as the correct latency value. Such functional testing used to determine latency of a connection between two stops in the ring can be time-consuming, particularly when used to characterize the latencies of all channels between all combinations of stops of an entire ring for larger rings. For example, such functional testing can take on the on the order of hours. The amount of time required to determine the latency between each stop is such that the functional-test solution for determining latency is not scalable to very large rings. The functional-test solution also has the drawback that only adjacent stops can be tested.

Figure 3:
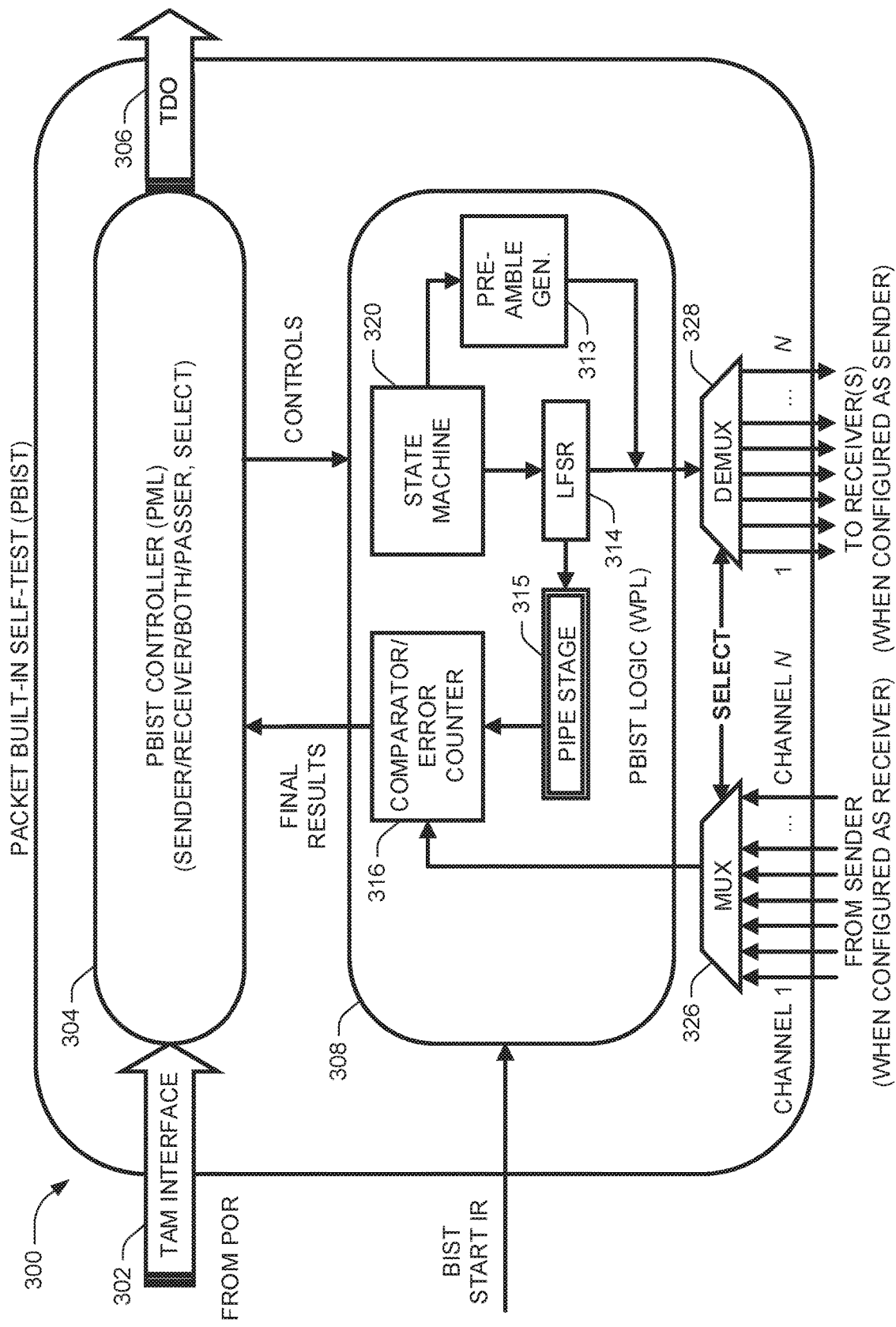
FIG. 3 is a block diagram of another example PBIST for use in a ring stop.

FIG. 3 illustrates example PBIST hardware 300 that can be incorporated into a superconducting chip serving as a ring stop in a superconducting ring like that of ring 100 illustrated in FIG. 1. PBIST hardware 300 is configured so as to obviate the need for functional testing to determine latency values and the need for programming latency values into BIST hardware on each chip. As in FIG. 2, ring connections are at the bottom of FIG. 3 and TAM interface inputs 302 and outputs 306 are shown at the top left and top right of FIG. 3. PBIST controller 304 can be implemented, for example, using reciprocal quantum logic (RQL), e.g., phase-mode logic (PML) RQL. PBIST logic 308 can be implemented using, for example, wave-pipeline logic (WPL) RQL. Channels for testing can be selected, and PBIST hardware 300 can be configured as either, both, or neither of a sender or receiver of test signals, as described above with respect to PBIST hardware 200.

PBIST controller 304 can provide control signals to PBIST logic 308. PBIST logic 308 can include a state machine 320 configured to place PBIST logic 220 in one of several states, starting with an idle (non-test) state. At the beginning of the testing state, as triggered by a signal from the BIST start IR, state machine 320 can either (a) remain in an idle state, or another state configured to do nothing except for allow the passage of signals received on the ring back out into the ring, based on the PBIST hardware 300 being configured as a passer; (b) engage preamble generation circuitry 313 to generate a preamble of a length and data composition understood by all receiver(s) active during the test, as may be programmed through interface 302, based on the PBIST hardware 300 being configured as a sender; or (c) wait to detect a preamble among signals incoming from the ring, based on the PBIST hardware 300 being configured as a receiver. PBIST logic 308 can include LFSR 314, configured to generate pseudo-random data, as described above. PBIST logic 308 can further include preamble generation circuitry 313, configured to generate a preamble of hardwired or programmed composition and length. For example, the preamble can take the form of a (0*1*)+ pattern. PBIST logic 308 can further include first-in, first-out (FIFO) pipe stage circuitry 315 configured to hold LFSR-generated data until released to comparator/error counter circuitry 316 upon recognition that the expected preamble has been received on the ring. The pseudo-random bitstream output of LFSR 314 can be provided to demultiplexer 328 for provision of the test data to the selected channels during the test, and/or can be provided to pipe stage 315 as compare data. In some examples, the preamble generation circuitry 313 is nothing more than the LFSR 314 itself, configured by design and/or programming (as by choosing its length and characteristic polynomial and/or by seeding its initial register values) to output a specific bit pattern at the beginning of the test.

Comparator/error counter circuitry 316 in PBIST hardware 300 can be configured first to test for receipt of a preamble pattern, which can be known to circuitry 316 by dint of being hardwired in PBIST logic 308 or programmable via interface 300. Comparator/error counter circuitry 316 in PBIST hardware 300 can be configured to, upon recognition of the known preamble pattern, compare received test data from multiplexer 326 with compare data from pipe stage 315, and to increment one or more error counters based on the detected errors, as described above. Through such comparison, PBIST hardware 300 is capable of testing if there is any uplink fault, stuck-at-zero condition, stuck-at-pulse condition, or any other type of fault in channels in the superconducting ring between transmitter and receiver.

As one example of using PBIST hardware 300, when a respective instance of PBIST hardware 300 is included in multiple chips in a superconducting ring, LFSR 314 can be initialized (e.g., via programming provided through interface 302) to an initial value. Error counter(s) in comparator/error counter 316 can be initialized to zero. A timeout counter (not shown) can also be initialized on both the sender and the one or more receivers. Based on PBIST hardware 300 being configured as a sender, preamble generation circuitry 313 can output to the ring, via demultiplexer 328, a test data preamble (e.g., of a (0*1*)+ pattern). Immediately after the preamble has been output, LFSR 314 can begin outputting pseudo-random test data to the ring via demultiplexer 328, and the timeout counter can be started (e.g., decremented periodically from an initial starting value). Based on PBIST hardware 300 being configured as a receiver, as bits are received via multiplexer 326 and compared in comparator/error counter 316, comparator/error counter 316 the error counter(s) in comparator/error counter 316 can accumulate the number of error bits detected. Upon each timeout, a new iteration of the LFSR 314 can generate a new test pattern. Final results, whether as one or more error counts, one or more BERs, and/or some other metric(s) based on the error count, can be reported back to PBIST controller 304, which can output a result on, for example, a test data out (TDO) pin 306.

The preamble pattern can, in some examples, be as simple as a single "1" value following one or more "0" values after the start of the test as signaled by the BIST start IR, such that comparison of received test data with compare data from pipe stage 315 begins immediately after receive the first "1" after a quiescent period starting from the beginning of the test. In other examples, the preamble can consist of a "0011" pattern (two zeroes followed by two ones), a "00001111" pattern (four zeroes followed by four ones), a "0000000011111111" pattern (eight zeroes followed by eight ones), a "00000000000000001111111111111111" pattern (sixteen zeroes followed by eight ones), or similar. In other examples, the preamble can consist of repeated instances of any of the above patterns. In any case, the preamble is known to the PBIST hardware for use as either sender (to generate the preamble pattern) or receiver (to detect the preamble pattern and thereafter begin compare data generation and comparison).

Figure 4:
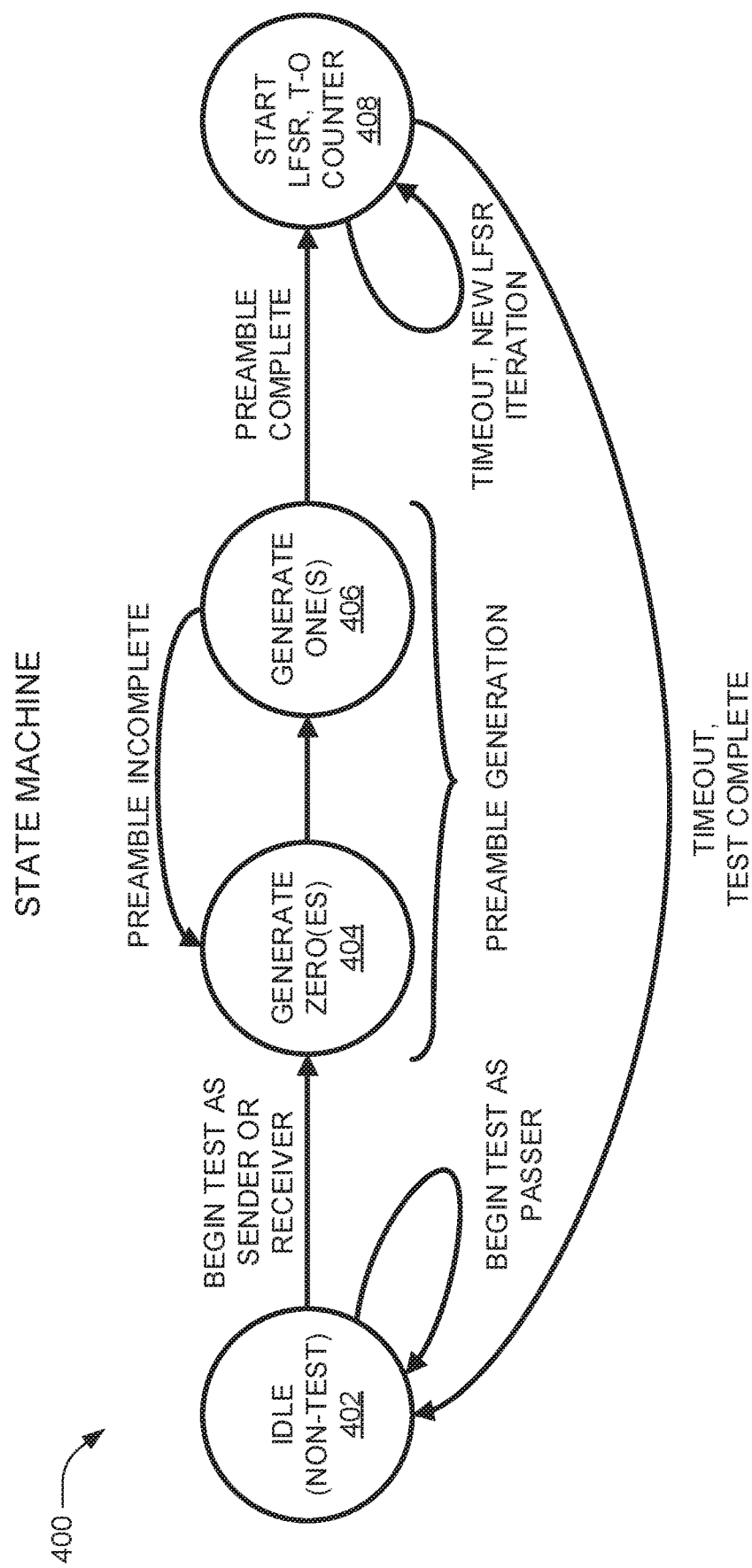
FIG. 4 is a state machine diagram of an example state machine in a PBIST.

FIG. 4 is a state machine diagram 400 illustrating an example behavior of a state machine in PBIST logic, e.g., state machine 320 in PBIST logic 308. An idle state 402 is sustained during non-test mode or during a test when the PBIST hardware is assigned as a passer. Based on the PBIST hardware being assigned as a sender, a receiver, or both, upon receipt of the test start signal from the BIST start IR, state machine 400 can direct one or more zeroes to be generated 404 (e.g., by preamble generation circuitry 313), followed by one or more ones 406, which cycle can continue until a hard-wired or programmed preamble length is reached. The (0*1*)+ pattern preamble can be sent out on the ring based on the PBIST hardware being configured as a sender. Following the completion of the preamble, the state machine 400 can start a timeout counter (e.g., counting down from a predefined or programmed value) and direct an LFSR (e.g., LFSR 314) to being generating test pattern data 408, which can be sent out on the ring based on the PBIST hardware being configured as a sender and/or stored in a pipe stage (e.g., pipe stage 315) based on the PBIST hardware being configured as a receiver. With each timeout until the test is complete, the LFSR can generate a new test pattern 408. When the test is complete, an idle state 402 can be returned to.

Figure 5:
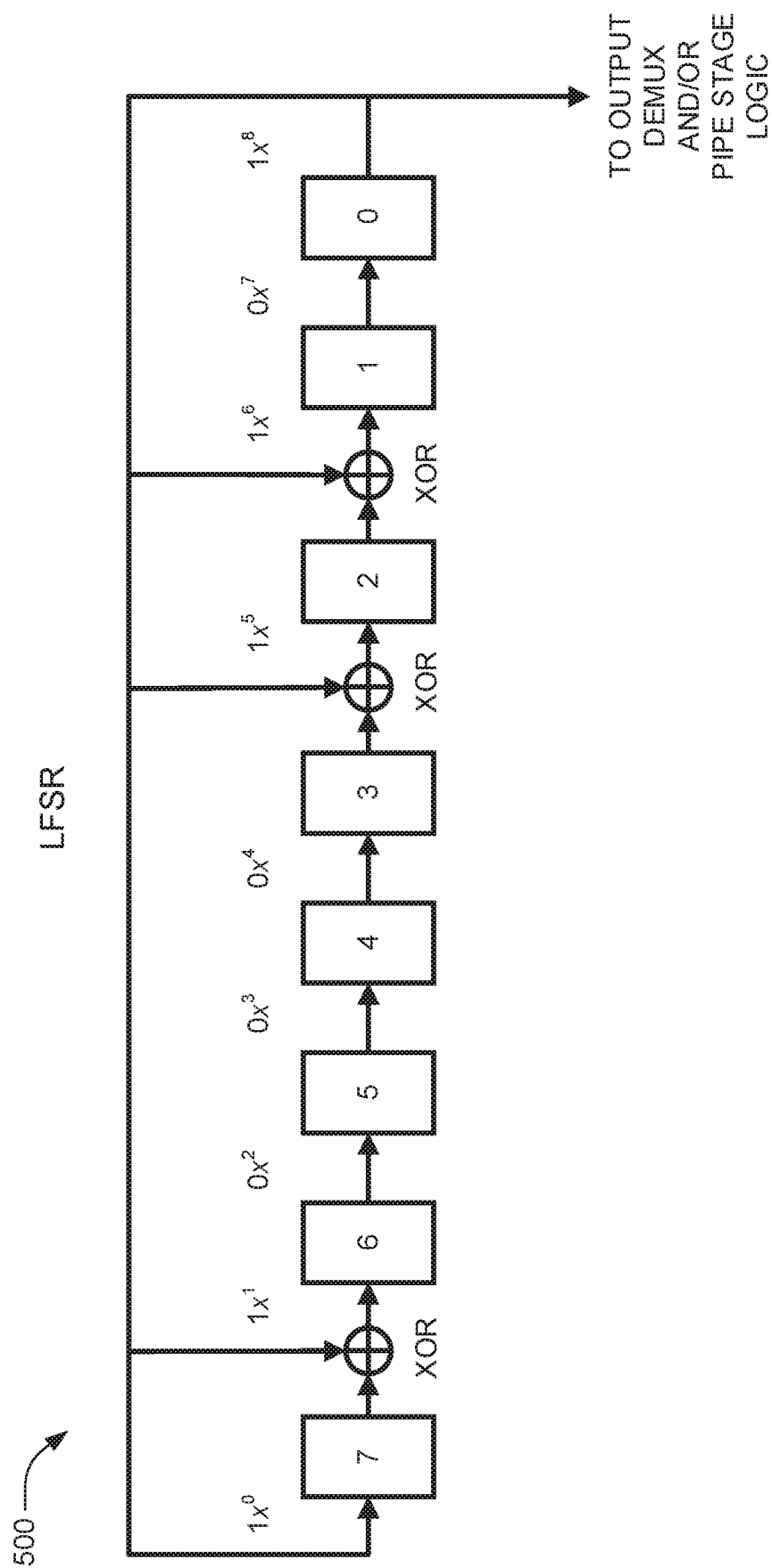
FIG. 5 is a diagram of an example linear-feedback shift register (LFSR).

FIG. 5 illustrates an example eight-bit internal-feedback LFSR 500 having primitive polynomial $x^8+x^6+x^5+x+1$ that can be used, for example, as LFSR 314 in PBIST hardware 300. LFSR 500 includes eight registers (rectangles numbered 0 through 7), three XOR gates (circles with crosses in them) and an output that can be supplied to an output demultiplexer, e.g., demultiplexer 328, based on the PBIST hardware being configured as a sender, and/or to pipe stage logic, e.g., pipe stage 315, based on the PBIST hardware being configured as a receiver. The registers can be seeded with an initial eight-bit value. The shifting can be controlled by a PBIST logic clock, e.g., an RQL clock operating at microwave frequencies. The below table illustrates an example output of the zeroth bit of the LFSR 500 for successive clock cycles as bits are shifted out of the output of the LFSR 500, for an initial LFSR value of "11011001".

| 1 | 0 | 1 | 0 | 0 | 1 | 1 | 1 |
|---|---|---|---|---|---|---|---|
| 1 | 1 | 1 | 0 | 1 | 1 | 1 | 0 |
| 0 | 1 | 1 | 0 | 0 | 1 | 1 | 1 |
| 1 | 0 | 1 | 1 | 0 | 0 | 1 | 0 |
| 0 | 0 | 0 | 1 | 0 | 0 | 0 | 0 |
| 0 | 0 | 1 | 1 | 1 | 0 | 0 | 1 |
| 0 | 0 | 1 | 0 | 0 | 1 | 1 | 0 |
| 0 | 0 | 1 | 0 | 0 | 1 | 1 | 1 |
| 0 | 1 | 0 | 1 | 0 | 1 | 1 | 0 |
| 1 | 0 | 0 | 0 | 1 | 0 | 0 | 0 |
| 1 | 0 | 1 | 0 | 0 | 1 | 0 | 0 |
| 0 | 1 | 1 | 1 | 1 | 1 | 0 | 0 |

-continued

| | | | | | | | |
|---|---|---|---|---|---|---|---|
| 0 | 0 | 0 | 0 | 0 | 1 | 0 | 1 |
| 1 | 1 | 0 | 0 | 0 | 1 | 1 | 1 |
| 0 | 1 | 1 | 1 | 1 | 0 | 0 | 0 |
| 1 | 0 | 1 | 1 | 0 | 0 | 1 | 1 |
| 0 | 1 | 1 | 0 | 0 | 0 | 0 | 1 |
| 1 | 1 | 1 | 0 | 0 | 1 | 1 | 1 |
| 0 | 0 | 0 | 0 | 1 | 0 | 1 | 0 |
| 1 | 1 | 1 | 1 | 1 | 1 | 1 | 1 |
| 0 | 0 | 1 | 0 | 1 | 1 | 1 | 1 |
| 0 | 1 | 0 | 0 | 1 | 0 | 1 | 0 |
| 0 | 0 | 0 | 1 | 1 | 0 | 1 | 1 |
| 1 | 0 | 1 | 1 | 0 | 1 | 1 | 1 |
| 1 | 1 | 0 | 1 | 0 | 1 | 1 | 1 |
| 0 | 1 | 0 | 0 | 0 | 0 | 0 | 1 |
| 1 | 0 | 0 | 1 | 0 | 1 | 0 | 1 |
| 0 | 1 | 0 | 0 | 0 | 1 | 1 | 0 |
| 1 | 0 | 1 | 1 | 0 | 0 | 0 | 1 |
| 1 | 0 | 0 | 0 | 0 | 0 | 1 | 0 |
| 0 | 1 | 0 | 1 | 1 | 0 | 1 | 1 |
| 0 | 1 | 0 | 1 | 0 | 0 | 1 | 1 |

Figure 6:
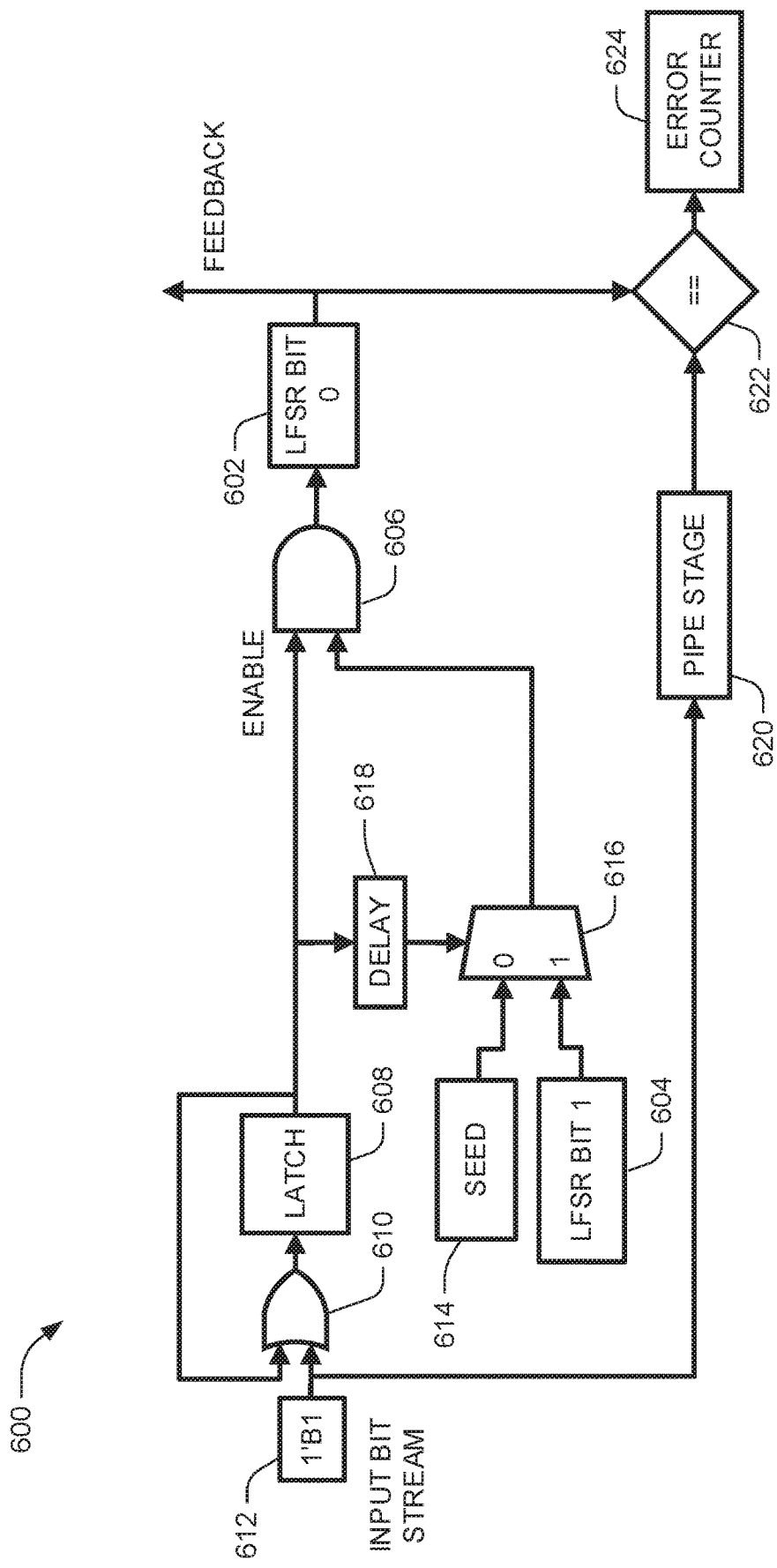
FIG. 6 is a diagram of an example test data comparison circuit in a PBIST.

FIG. 6 illustrates example circuitry 600 that can be used in PBIST hardware to compare an input bit stream to an LFSR bit stream, in the example that the test-data preamble is a single "1" bit preceded by any number of "0" bits. In the example circuitry 600, the LFSR is configured by design to put out a "1" as its first output bit, which also serves as a signal to the receiver to begin comparing data. LFSR bit zero 602 is fed by multiplexed-in LFSR bit one 604 based on an enable signal to AND gate 606. The enable signal comes from latch 608. On test start-up, latch 608 holds a value of "0" and the input bit stream, including its incoming bit 612, is all "0"s. The function of latch 608 together with OR gate 610 is to make the enable signal "0", disabling the transfer of LFSR bit one 604 to LFSR bit zero 602 via AND gate 606, up until the input bit stream shows its first "1"-valued bit as the incoming bit 612. As soon as the input bit stream shows its first "1"-valued bit as the incoming bit 612, and at all times thereafter until latch 608 is reset to "0", latch 608 remains at a value of "1" regardless of the value of the incoming bit 612 of the input bit stream. As soon as input bit stream shows a value of "1" as its incoming bit 612, the value of seed 614 is fed into LFSR bit zero 602 via multiplexer 616 and AND gate 606, because delay 618 prevents the select line of multiplexer 616 from going high (now that latch 608 holds a value of "1"). Upon expiry of the delay 618, the latch 608 value of "1" is fed into select line of multiplexer 616 and LFSR bit one 604 is fed into LFSR bit zero 602 every clock cycle. The incoming bit(s) 612 of input bit stream are also fed into pipe stage 620 and subsequently compared with the LFSR bit zero 602 at comparator 622. A mismatch between LFSR bit zero 602 and the pipe-staged input bit stream results in incrementing error counter 624. Comparator 622 and error counter 624 can correspond, for example, to comparator/error counter 316 in PBIST hardware 300. LFSR bit zero 602 can also be provided to LFSR feedback as shown in FIG. 6. Although circuitry 600 as illustrated is adapted to trigger comparison as soon as the input bit stream shows a "1" (e.g., for a preamble value of "01"), circuitry 600 can be adapted to detect other preamble values, such as those discussed above.

Figure 7:
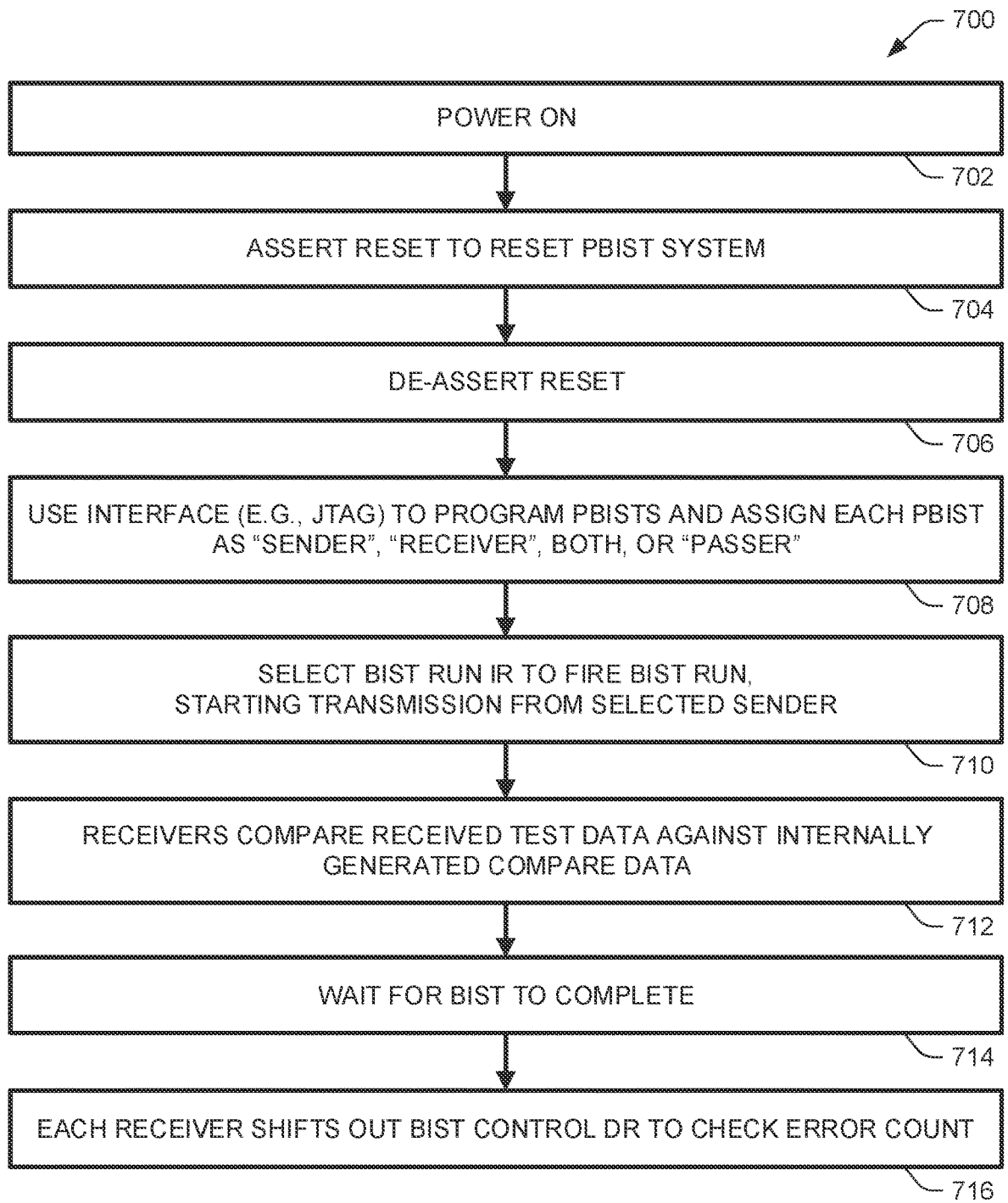
FIG. 7 is a flow diagram of an example method of operating a PBIST system.

FIG. 7 illustrates an example method 700 of using a PBIST system to characterize and localize errors in superconducting ring. After power on 702, a reset signal can be asserted 704 to reset the PBIST system. This resetting, for example, can clear pipe stages of data, can reset any error counters, can clear any result registers, and can place a PBIST logic state machine into its initial idle state. The reset signal can then be de-asserted 706. An interface, such as JTAG, can then be used to program 708 the instances of PBIST hardware in each ring stop and thereby assign each PBIST its status as a sender, receiver, both sender and receiver, or passer (neither sender nor receiver). Multiple ring stops can be programmed as a receiver. All ring stops not programmed as senders and/or receivers are programmed as passers. A BIST RUN instruction register (IR) can be selected 710 to fire the BIST run, which starts the transmission from the selected sender. Receivers then compare 712 received test data against internally generated compare data. The system waits 714 for BIST to complete, e.g., for the receiver(s) to finish receiving all test data. Then, each receiver can shift out 716 a BIST control data register (DR) to check the error count.

Figure 8:
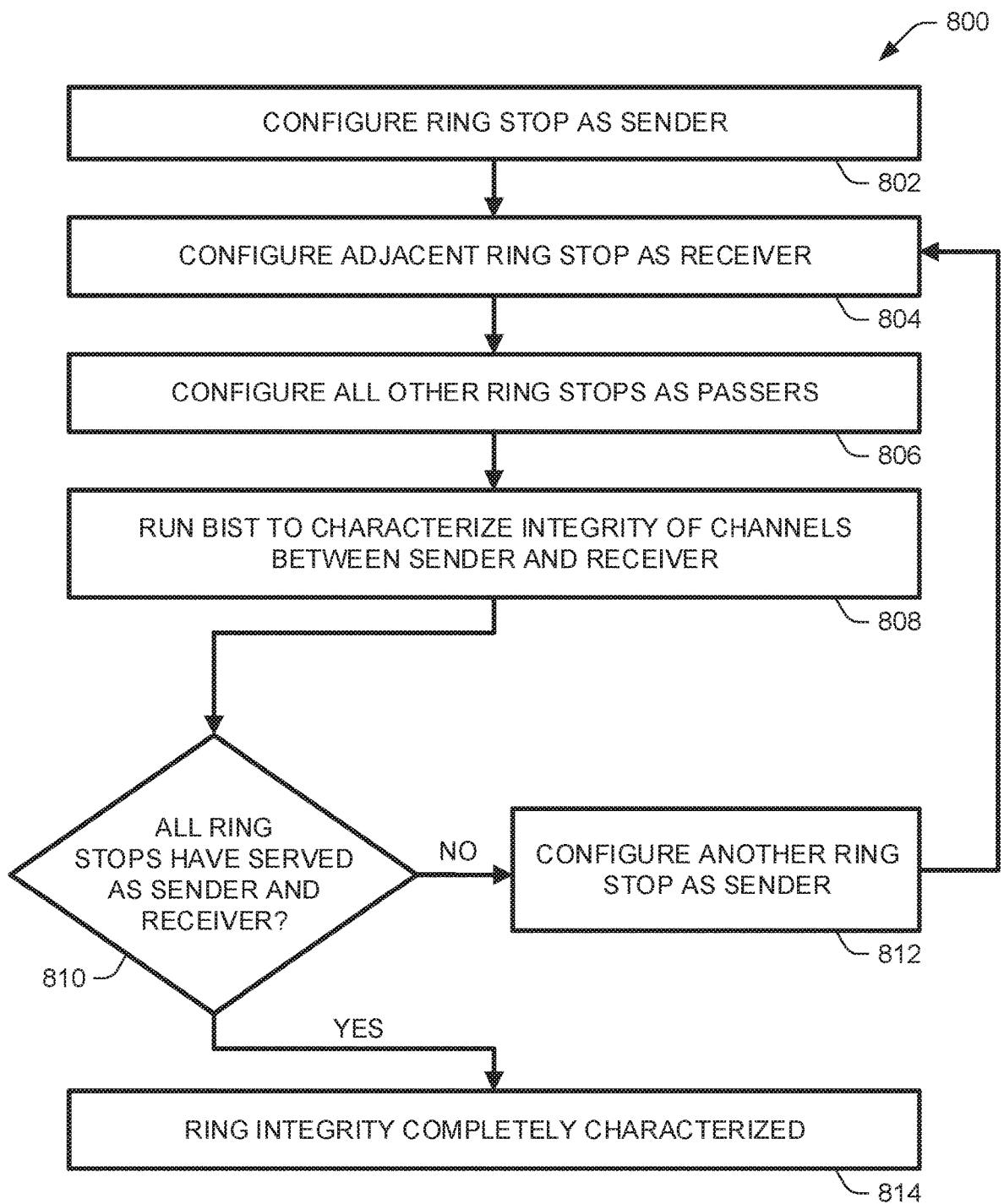
FIG. 8 is a flow diagram of an example method of detecting faults in a ring of superconducting circuits.

FIG. 8 illustrates a method 800 of characterizing the integrity of all connections in a superconducting ring using a PBIST system, each ring stop having PBIST hardware. The ring can, for example, be like ring 100 shown in FIG. 1. A ring stop is configured 802 as a sender of test data, and ring stop adjacent to the sender is configured as a receiver 804 that compares received test data to generated compare data. All other ring stops in the ring are configured as passers 806. Such configuration can be done by programming PBIST hardware in each ring stop, e.g., through an appropriate interface, e.g., a JTAG interface. A built-in self-test is then run 808 to characterize the integrity of one or more channels between the sender and the receiver. For example, all channels between sender and receiver are tested, either sequentially or in parallel. The test can be as described above, e.g., using an LFSR to generate test data at the sender and compare data at the receiver. The integrity characterization can, for example, include or be based on a determination of BER. Based on not all ring stops having served as sender and receiver in different tests 810, another ring stop is configured 812 as sender, and an adjacent ring stop is configured as receiver 804. For example, the ring stop used as receiver in the previous completed test can be configured as the sender.

Based on all ring stops having served as sender and receiver in different tests 810, the ring integrity is completely characterized 814, providing information by which faults can be diagnosed and localized for repair or replacement of particular ring connections. For example, repair can entail stripping off of superconducting tape and re-doing of connections. As another example, if one or more channels are found to be faulty, circuitry can be programmed to employ functional fallbacks such as re-routing signals through a known-good subset of all wires. As a consequence of method 800 and the PBIST hardware described above, testing is easily scalable to rings of any number of stops, and large-scale testing can be made efficient through the elimination of hours of test setup time, such as may be required for testing of individual connections or functional tests used to characterize latency of individual connections. The saved test setup time is multiplied by the thousands of devices and assemblies required to be tested when building a large-scale cryogenic supercomputer.

The BER determined by a PBIST system of the type described herein can also be used to adjust and tune the transition of channels. Each individual chip in a superconducting ring like ring 100 can have a resonance clock that is fundamental to its RQL circuitry. Each of the chips, however, can have—as a result of manufacturing differences, for example—a slightly different resonance point or frequency that the chip is optimized to run at. During assembly, chips with similar resonance clock frequencies can be grouped together. Or, for pairs or groups of chips with more dissimilar resonance clock frequencies, there may need to be a compromise in data transmission rates on the ring, such that a data transmission frequency is ideal for a first chip, but under the ideal frequency for a second chip and potentially over the ideal frequency for a third chip. One or more clocks can be adjusted iteratively while performing BISTs configured to ascertain an overall system error rate such that the overall system error rate is minimized. Such clock adjustment may include one or more of adjusting the data transmission frequency for the ring and/or adjusting the clock frequencies, duty cycles, transition times, or other clock characteristics of individual chips. Although there may be mechanisms for error correction built into a ring packet system, it is nevertheless still desirable to be able to tune the system to a point at which it operates the most efficiently, with the lowest overall bit error rate. Accordingly, a PBIST system as described herein can be used to tweak the clock(s) of chips until the overall bit error rate is optimally low. As such, a PBIST system as described herein is not only useful for detecting faulty hardware at time of assembly, but can also be used to tune a ring system for ideal operation.

Figure 9:
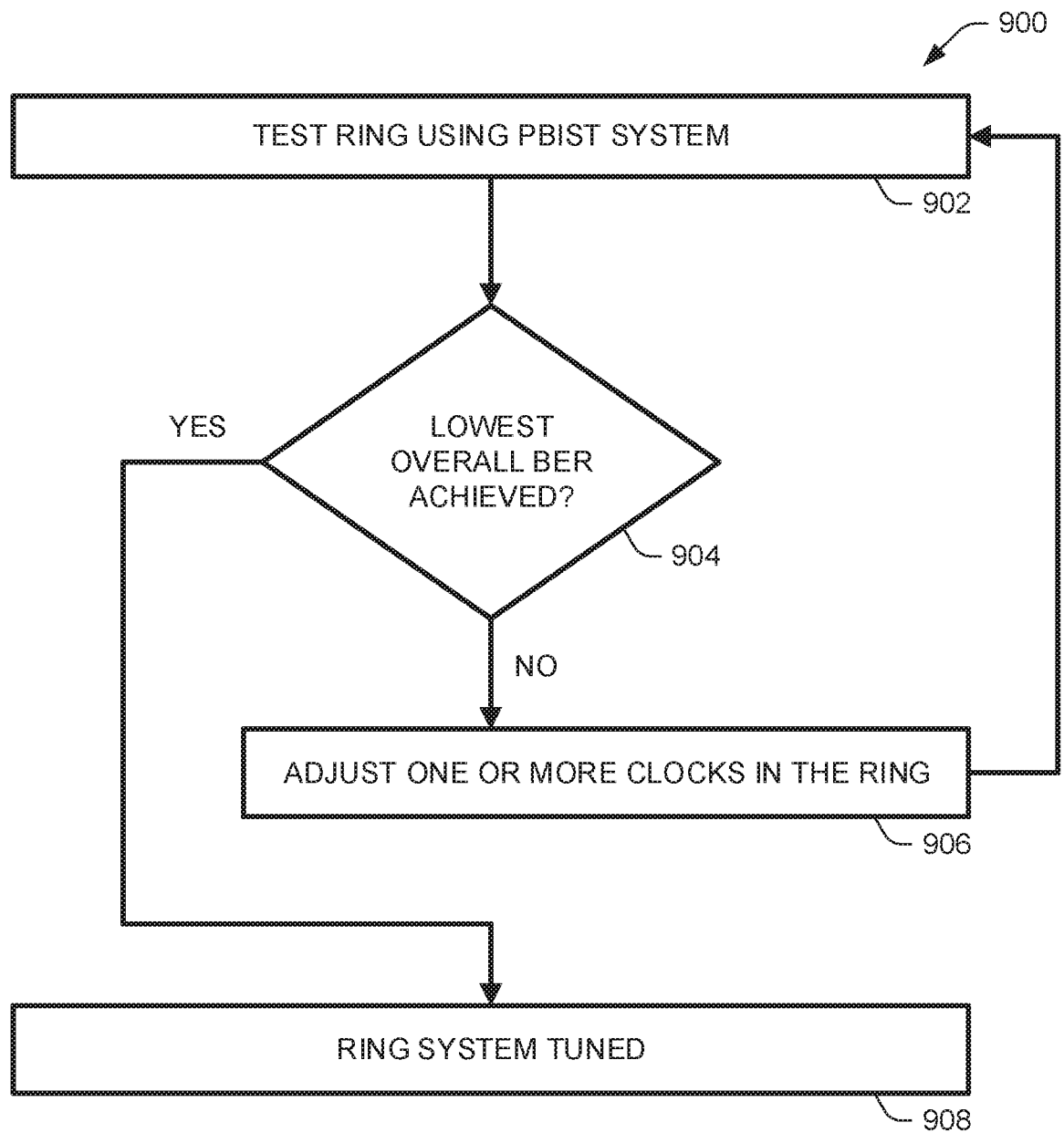
FIG. 9 is a flow diagram of an example method of tuning one or more clocks in a superconducting ring system.

FIG. 9 illustrates a method 900 of tuning a ring system for optimal operating. A ring can be repeatedly tested 902 using a PBIST system, for example, as described with regard to FIG. 8 or elsewhere herein. The overall system BER can be noted, for example by making testing the ring with a single ring stop serving as both sender and receiver, or by summing or averaging the BER of individual connections for sender/receiver pairs. One or more clocks in the ring can be adjusted 906 and the test repeated 902. After a number of tests, based on the lowest overall BER being achieved by some combination of clock settings, the ring system can be said to have been tuned 908. Based on the overall BER not being the lowest achieved, clock settings can be adjusted again 906 and the ring can be tested again 902.

Figure 10:
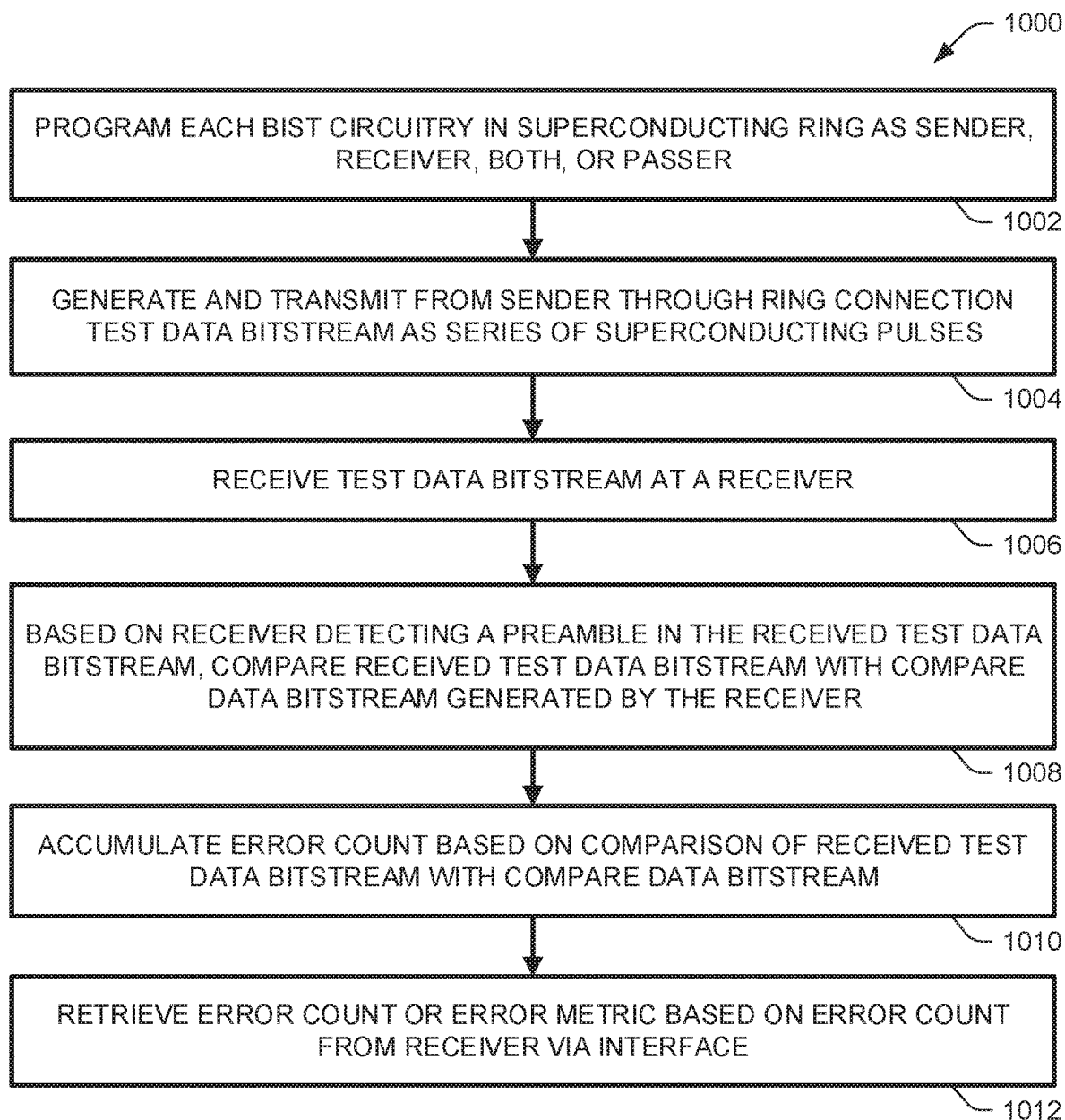
FIG. 10 is a flow diagram of an example method of testing connections between ring stops in superconducting ring circuitry.

FIG. 10 illustrates a method 1000 of testing connections between ring stops in superconducting ring circuitry. A number of instances of superconducting BIST circuitry in chips in a superconducting ring are programmed 1002 to be one or both of senders of test data and/or receivers of test data, or otherwise passers of test data. Each receiver is configured to compare test data to compare data generated within the receiver. Each passer is configured to retransmit received test data to an adjacent ring stop. A test data bitstream is generated and transmitted 1004 as a series of superconducting pulses at one or more microwave frequencies from a sender through a ring connection. For example, the test data can be generated by an LFSR in the sender. The test data bitstream is received 1006 at a receiver. The received test data bitstream is not necessarily identical to the transmitted test data bitstream because it may include errors as a result of circuitry faults. The received test data bitstream is compared 1008 with a compare data bitstream generated by the receiver, the comparison being based on the receiver detecting a preamble in the received test data bitstream. For example, the compare data can be generated by an LFSR in the receiver. The compare data can, for example, be stored in a pipe stage until the receiver detects the preamble in the received test data bitstream. For example, the detected preamble can begin with at least one binary "1" value following a number of binary "0" values. An error count is then accumulated 1010 based on the comparison of the received test data bitstream with the compare data bitstream. The error count or an error metric based on the error count is retrieved 1012 from the receiver via an interface, e.g., a JTAG interface.

As detailed in method 800 of FIG. 8, faults can be localized to particular connections in a superconducting ring, by successively testing connections between adjacent ring stops in the superconducting ring according to method 1000 of FIG. 10 until all connections in the ring have been tested and the integrity of all channels of each connection have been characterized by the respective error counts or the respective error metrics based on the respective error counts. Furthermore, as detailed in method 900 of FIG. 9, clocks in chips of a superconducting ring system can be tuned by repeatedly testing connections in the superconducting ring according to method 100 of FIG. 10 and iteratively adjusting one or more clocks in the ring between tests such that the overall bit error rate of the ring is lowered.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. Superconducting built-in self-test (BIST) circuitry comprising:
controller circuitry configured to receive self-test configuration programming inputs through an interface and to output self-test results through the interface;
self-test logic circuitry comprising a state machine, a comparator, and an error counter and configured to receive control signals from the controller circuitry, and to:
generate test data for transmission onto one or more channels of a superconducting ring of chips, based on the BIST circuitry being programmed as a transmitter; and
accumulate an error count in the error counter based on comparison, with the comparator, of receive test data with compare data, based on the BIST circuitry being programmed as a receiver, wherein the error count is indicative of the integrity of one or more channels connecting different chips in the superconducting ring.

2. The BIST circuitry of claim 1, wherein the controller circuitry is implemented using phase-mode logic (PML) reciprocal quantum logic (RQL) circuitry.

3. The BIST circuitry of claim 1, wherein the self-test logic circuitry is implemented using wave-pipeline logic (WPL) reciprocal quantum logic (RQL) circuitry.

4. The BIST circuitry of claim 1, wherein the self-test logic circuitry comprises a linear-feedback shift register (LFSR) configured to generate the test data and/or the compare data.

5. The BIST circuitry of claim 4, wherein the self-test logic circuitry comprises a pipe stage configured to store compare data generated by the LFSR, and wherein the self-test logic circuitry is configured to begin comparing compare data from the pipe stage based on detection of a preamble in the received test data indicating the start of the test data.

6. The BIST circuitry of claim 5, wherein the preamble comprises at least one binary "1" value following a number of binary "0" values.

7. The BIST circuitry of claim 1, wherein the interface is a Joint Test Action Group (JTAG) interface.

8. A superconducting ring comprising a plurality of integrated circuit chips as ring stops in the ring, a plurality of the ring stops comprising the BIST circuitry of claim 1.

9. A method of testing connections between ring stops in superconducting ring circuitry, the method comprising:
  programming a number of instances of superconducting built-in self-test (BIST) circuitry in chips in a superconducting ring to be one or both of senders of test data and/or receivers of test data, or otherwise passers of test data, each receiver being configured to compare test data to compare data generated within the receiver, each passer being configured to retransmit received test data to an adjacent ring stop;
  generating and transmitting at one or more microwave frequencies from a sender through a ring connection a test data bitstream as a series of superconducting pulses;
  receiving the test data bitstream at a receiver;
  based on the receiver detecting a preamble in the received test data bitstream, comparing the received test data bitstream with a compare data bitstream generated by the receiver;
  accumulating an error count based on the comparison of the received test data bitstream with the compare data bitstream;
  retrieving the error count or an error metric based on the error count from the receiver via an interface.

10. The method of claim 9, wherein the test data is generated by a linear-feedback shift register (LFSR) in the sender and the compare data is generated by an LFSR in the receiver.

11. The method of claim 10, further comprising storing the compare data in a pipe stage until the receiver detects the preamble in the received test data bitstream.

12. The method of claim 11, wherein the detected preamble comprises at least one binary "1" value following a number of binary "0" values.

13. The method of claim 9, wherein the interface is a Joint Test Action Group (JTAG) interface.

14. A method of localizing faults to particular connections in a superconducting ring, the method comprising successively testing connections between adjacent ring stops in the superconducting ring according to the method of claim 9 until all connections in the ring have been tested and the integrity of all channels of each connection have been characterized by the respective error counts or the respective error metrics based on the respective error counts.

15. A method of tuning clocks in chips of a superconducting ring system, the method comprising repeatedly testing connections in the superconducting ring according to the method of claim 9 and iteratively adjusting one or more clocks in the ring between tests such that the overall bit error rate of the ring is lowered.

16. Reciprocal quantum logic (RQL) built-in self-test (BIST) circuitry comprising:
  ring outputs to a plurality of superconducting ring connection channels;
  ring inputs from the plurality of superconducting ring connection channels;
  a phase-mode logic (PML) BIST controller accessible via a Joint Test Action Group (JTAG) interface;
  wave-pipeline logic (WPL) BIST logic coupled to the BIST controller, the BIST logic comprising:
    a state machine configured to provide a data generation start signal;
    a linear-feedback shift register (LFSR) configured to begin generating a test data and/or compare data bitstream based on receiving the data generation start signal;
    a pipe stage configured to store the compare data bitstream;
    a comparator configured to begin comparing test data received from the ring inputs with the compare data stored in the pipe stage upon detection of a preamble in the received test data; and
    an error counter configured to accumulate an error count based on the comparison of the received test data with the compare data.

17. The BIST circuitry of claim 16, further comprising preamble generation circuitry configured to generate the preamble as a (0*1*)+ pattern.

18. The BIST circuitry of claim 16, wherein the LFSR is an 8-bit LFSR having a characteristic polynomial of $x^8+x^6+x^5+x+1$.

19. The BIST circuitry of claim 16, further comprising a multiplexer coupling the ring inputs to the comparator and a demultiplexer coupling the LFSR to the ring outputs, wherein the multiplexer and the demultiplexer are both fed a select signal controlled by the BIST controller and programmable via the JTAG interface, the select signal determining which one or more ring connection channels are tested during a test.

20. The BIST circuitry of claim 16, further comprising circuitry configured to cause the comparator to begin comparing the received test data with the compare data based on detecting a "1" bit following one or more "0" bits in the received test data.

* * * * *